(12) United States Patent
Lai et al.

(10) Patent No.: US 10,281,129 B1
(45) Date of Patent: May 7, 2019

(54) FILAMENT STRUCTURE OF LED LIGHT BULB

(71) Applicant: BGT MATERIALS LIMITED, Manchester (GB)

(72) Inventors: Chung-Ping Lai, Hsinchu County (TW); Kuo-Hsin Chang, Chiayi (TW)

(73) Assignee: BGT Materials Limited (GB)

( * ) Notice: Subject to any disclaimer, the term of this patent is extended or adjusted under 35 U.S.C. 154(b) by 0 days.

(21) Appl. No.: 16/053,801

(22) Filed: Aug. 3, 2018

Related U.S. Application Data (63) Continuation-in-part of application No. 15/874,343, filed on Jan. 18, 2018, now Pat. No. 10,082,256.

(51) Int. Cl.
| | | |
|---|---|---|
| *F21K 99/00* | (2016.01) |
| *F21V 23/00* | (2015.01) |
| *F21V 29/503* | (2015.01) |
| *H01L 25/075* | (2006.01) |
| *H01R 33/22* | (2006.01) |
| *F21V 29/89* | (2015.01) |
| *F21V 29/85* | (2015.01) |
| *F21K 9/232* | (2016.01) |
| *F21Y 115/10* | (2016.01) |

(52) U.S. Cl.
CPC ............ *F21V 29/503* (2015.01); *F21K 9/232* (2016.08); *F21V 29/85* (2015.01); *F21V 29/89* (2015.01); *H01L 25/0753* (2013.01); *H01R 33/22* (2013.01); *F21Y 2115/10* (2016.08)

(58) Field of Classification Search
CPC ........ F21V 29/503; F21V 29/85; F21V 29/89; F21K 9/232; H01R 33/22; H01L 25/0753; F21Y 2115/10
See application file for complete search history.

(56) References Cited

U.S. PATENT DOCUMENTS

| | | | | |
|---|---|---|---|---|
| 5,510,174 A * | 4/1996 | Litman | .................... | C08K 3/38 |
| | | | | 428/343 |
| 6,918,983 B2 * | 7/2005 | Tobita | ........................ | C09J 5/00 |
| | | | | 156/272.4 |
| 8,400,051 B2 * | 3/2013 | Hakata | ................ | H01L 25/0753 |
| | | | | 313/110 |

(Continued)

OTHER PUBLICATIONS

."Boron Nitride Products for Thermal Solutions" TopSpin Design Co. 2006, pp. 1-11.*

*Primary Examiner* — Tracie Y Green (57) ABSTRACT

A light-emitting diode light bulb contains: a screw base, a transparent housing, at least one filament support, and at least one LED filament. The transparent housing includes an opening, and the screw base includes a positive terminal and a negative terminal. Each filament support includes two metal posts. Each LED filament includes a substrate, a first electrode pin, a second electrode pin, a thermal radiation film, at least one LED chip, a wire, and a fluorescent. The at least one LED chip is electrically connected with the first and second electrode pins, the first electrode pin is electrically connected with a first metal post, and the second electrode pin is electrically connected with a second metal post. The at least one LED filament and the at least one filament support are accommodated in the transparent housing, the screw base is housed into the opening, and the opening is closed.

10 Claims, 9 Drawing Sheets

(56) References Cited

U.S. PATENT DOCUMENTS

| | | | | |
|---|---|---|---|---|
| 8,587,945 B1* | 11/2013 | Hartmann | ......... | H05K 7/20454 |
| | | | | 361/679.53 |
| 2012/0133263 A1* | 5/2012 | Yang | ..................... | F21K 9/00 |
| | | | | 313/46 |
| 2013/0215625 A1* | 8/2013 | Takeuchi | .............. | F21V 23/001 |
| | | | | 362/363 |
| 2014/0362565 A1* | 12/2014 | Yao | .................... | H01L 25/0753 |
| | | | | 362/223 |
| 2015/0323139 A1* | 11/2015 | Tseng | .................... | F21K 9/232 |
| | | | | 362/650 |
| 2017/0347493 A1* | 11/2017 | Arai | .................. | H05K 7/20481 |

* cited by examiner

FILAMENT STRUCTURE OF LED LIGHT BULB

This application is a Continuation-in-Part of application Ser. No. 15/874,343, filed on Jan. 18, 2018.

BACKGROUND OF THE INVENTION

Field of the Invention

The present invention relates to a filament structure of a light-emitting diode (LED) light bulb which improves heat dissipation and radiation.

Description of the Prior Art

A conventional light-emitting diode light (LED) bulb contains at least LED filament with transparent substrate, such as glass substrate or sapphire substrate, wherein a plurality of LED dies are adhered on one surface of the transparent substrate, and the at least one LED filament are made by using a fluorescent glue and in a wire bonding process.

In addition, a filament support is made of glass and is configured to support the at least one LED filament, but its heat conductivity is insufficient.

The present invention has arisen to mitigate and/or obviate the afore-described disadvantages.

SUMMARY OF THE INVENTION

The primary aspect of the present invention is to provide a light-emitting diode (LED) light bulb which improves heat dissipation and radiation To obtain the above aspect, an LED light bulb provided by the present invention contains: a screw base, a transparent housing, at least one filament support, and at least one LED filament.

The transparent housing is hollow and includes an opening, and the screw base includes a positive terminal and a negative terminal which are electrically connected with an external power supply so as to supply driving power to the at least one LED filament, wherein each of the at least one filament support includes a first metal post electrically connected with the positive terminal of the screw base and includes a second metal post electrically connected with the negative terminal so as to transmit the driving power.

Each of the at least one LED filament includes a substrate, a first electrode pin and a second electrode pin which are arranged on two sides of the substrate respectively, a thermal radiation film formed on a back face of the substrate, at least one LED chip molded on a front face of the substrate, a wire, and a fluorescent.

The at least one LED chip is electrically connected with the first electrode pin and the second electrode pin in a series connecting manner by using the wire, wherein the first electrode pin is electrically connected with the first metal post, and the second electrode pin is electrically connected with the second metal post so that an LED drive circuit is defined.

The at least one LED filament and the at least one filament support are accommodated in the transparent housing, and the screw base is housed into the opening of the transparent housing, and the opening is closed.

DETAILED DESCRIPTION OF THE PREFERRED EMBODIMENTS

Figure 1:
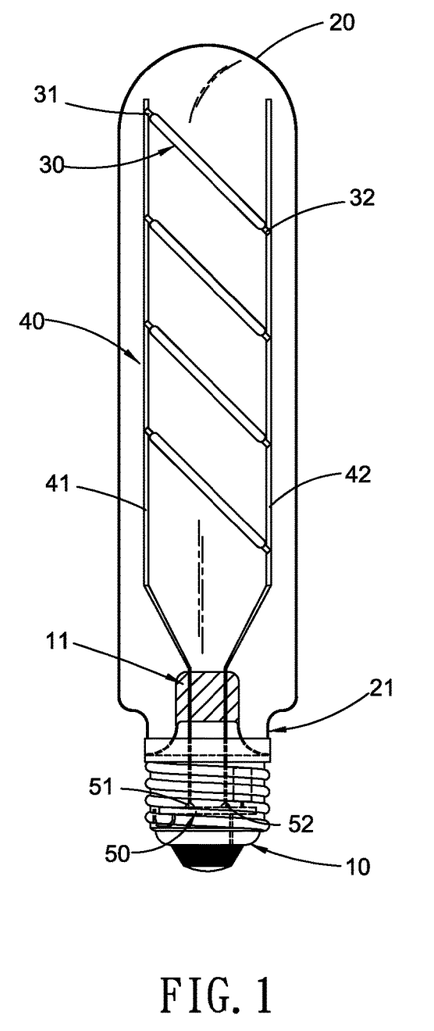
FIG. 1 is a schematic view showing the assembly of an LED light bulb according to a preferred embodiment of the present invention.

With reference to FIG. 1, a light-emitting diode (LED) light bulb according to a preferred embodiment of the present invention comprises: a screw base 10, a transparent housing 20, at least one filament support 40, and at least one LED filament 30.

The screw base 10 is electrically connected with an external power supply so as to supply driving power to the at least one LED filament 30. The screw base 10 is any one of Edison screw (as shown in FIG. 1 and designate as E22, E26, and E27), bi-pin connector (designated as GU10), and bayonet cap (designated as B22). The at least one LED filament 30 is driven by the external power supply to emit lights, and the external power supply supplies DC power, for example, the screw base 10 is mounted on a lamp holder for supplying the DC power. In another embodiment, the screw base 10 converts AC power of the external power supply into the DC power. Referring to FIG. 1, the screw base 10 includes a power controller 50 electrically connected therewith, and the power controller 50 is a light-emitting diode (LED) drive circuit, an input end of which is electrically connected with the DC power, and an output end of the LED drive circuit has a positive terminal 51 and a negative terminal 52 which output the DC power, such that the power controller 50 converts electric energy from the external power supply into driving power for driving the at least one LED filament 30. For example, the screw base 10 is electrically with a holder of the AC power, and the power controller 50 converts electric energy from the AC power into the DC power so as to drive the at least one LED filament 30.

The transparent housing 20 is hollow and includes an opening 21, and the transparent housing 20 is made of glass. The at least one LED filament 30 and the at least one filament support 40 are accommodated in the transparent housing 20 from the opening 21 of the transparent housing 20, and gases (such as nitrogen or noble gases) are filled into the transparent housing 20, thereafter the opening 21 is closed by the screw base 10.

Each of the at least one filament support 40 includes a first metal post 41 electrically connected with the positive terminal 51 of the screw base 10 and includes a second metal post 42 electrically connected with the negative terminal 52 so as to transmit the driving power. The screw base 10 has a glass seat 11 on which the first metal post 41 and the second metal post 42 are mounted, wherein the first metal post 41 inserts through the glass seat 11 to electrically connect with the positive terminal 51 of the power controller 50, and the second metal post 42 inserts through the glass seat 11 to electrically connect with the negative terminal 52 of the power controller 50.

Figure 6:
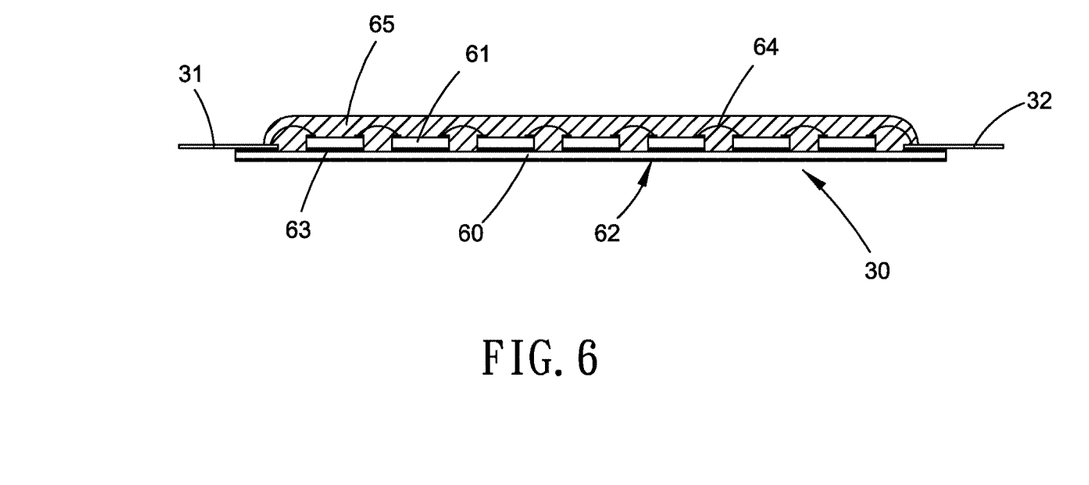
FIG. 6 is a cross sectional view of FIG. 5.

Referring to FIG. 6, each of the at least one LED filament 30 includes a substrate 60, wherein at least one LED chip 61 is molded on a front face of the substrate 60, a first electrode pin 31 and a second electrode pin 32 are arranged on two sides of the substrate 60 respectively, wherein the first electrode pin 31 is electrically connected with the first metal post 41, the second electrode pin 32 is electrically connected with the second metal post 42 so that the LED drive circuit is defined.

The at least one LED chip 61, the first electrode pin 31 and the second electrode pin 32 are adhered on the front face of the substrate 60 by way of a solid crystal glue 63 made of graphene or hexagonal boron nitride (hBN), wherein multiple LED chips 61 are electrically connected with the first electrode pin 31 and the second electrode pin 32 in a series connecting manner by using a wire 64, and the wire is made in a wire bonding process. A fluorescent glue 65 packages the multiple LED chips 61 on the substrate 60, and parts the first electrode pin 31 and the second electrode pin 32 expose outside the fluorescent glue 65. The substrate 60 contains a thermal radiation film 62 formed on a back face thereof.

Figure 7:
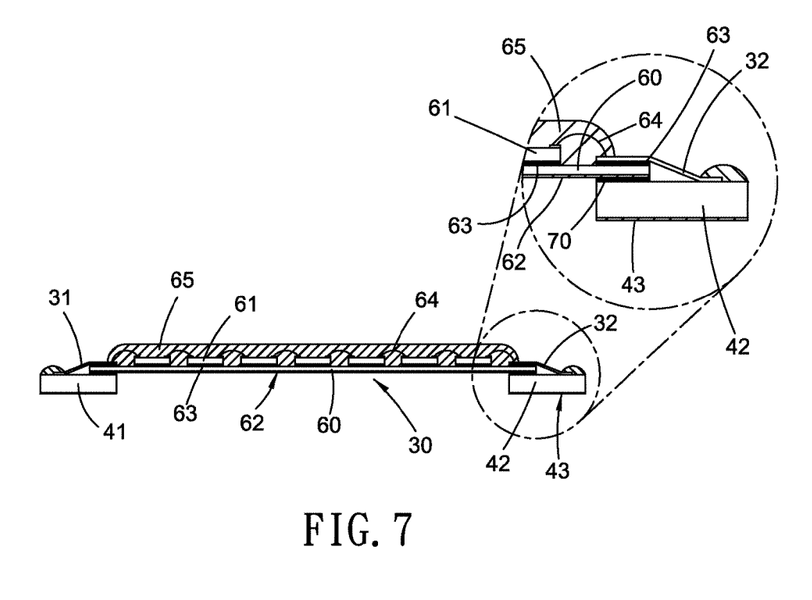
FIG. 7 is another cross sectional view of FIG. 5.

With reference to FIG. 7, the substrate 60 is mounted on the first metal post 41 and the second metal post 42 by means of electrical insulating glue 70 so as to avoid short circuit of the substrate 60 between the first metal post 41 and the second metal post 42.

In another embodiment, the first electrode pin 31 and the second electrode pin 32 of each LED filament 30 are soldered on a first surface of the first metal post 41 and a first surface of the second metal post 42 respectively so that the first metal post 41 and the second metal post 42 transmit the DC power to each LED filament 30, thus emitting lights from each LED filament 30.

In another embodiment, as illustrated in FIG. 7, any one of graphene, borazon (bn) and thermally conductive ceramic powders is coated on each of the first metal post 41 and the second metal post 42 so as to form a black body radiation layer 43. Preferably, the black body radiation layer 43 is coated on a second surface of the first metal post 41 and a second surface of the second metal post 42, such that when a part of heat transmits to the first metal post 41 and the second metal post 42 from each LED filament 30 via the first electrode pin 31 and the second electrode pin 32, thermal conductivity and thermal radiation area of the first metal post 41 and the second metal post 42 increase by using the graphene, the borazon (bn) or the thermally conductive ceramic powders of the black body radiation layer 43. In addition, heat exchange of the first metal post 41, the second metal post 42, and the gases in the transparent housing 20 enhances greatly so as to improve heat dissipation and radiation.

The substrate 60 of each LED filament 30 is made of any one of metal, (flexible) ceramics, (flexible) glass, sapphire, and plastic. Preferably, each LED filament 30 is flexible.

The thermal radiation film 62 is formed on the back face of the substrate by coating thermal radiation dissipation ink on the back face of the substrate in any one of a spray coating manner, a brushing manner, a screen printing manner, and a nozzle printing manner, wherein the thermal radiation dissipation ink contains dissipation fillers, dispersants, and binders.

The dissipation fillers are any one of carbon materials, metal particles, ceramics materials, infrared-ray radiation powders, and a mixture of the carbon materials, the metal particles, the ceramics materials, and the infrared-ray radiation powders.

The carbon materials are any one of graphene, carbon black, graphite, carbon nanotubes, activated carbon and a mixture of the graphene, the carbon black, the graphite, the carbon nanotubes, and the activated carbon.

The metal particles are any one of copper (Cu), nickel (Ni), zinc (Zn), iron (Fe), cobalt (Co), silver (Ag), gold (Au), platinum (Pt), and a mixture of the Cu, the Ni, the Zn, the Fe, the Co, the Ag, the Au, and the Pt.

The infrared-ray radiation powders are made of any one of silica ($SiO_2$), alumina ($Al_2O_3$), titanium dioxide ($TiO_2$), zirconia ($ZrO_2$), zirconium carbide (ZrC), silicon Carbide (SiC), tantalum carbide (TaC), titanium diboride ($TiB_2$), zirconium diboride ($ZrB_2$), two titanium silicide ($TiSi_2$), silicon nitride ($Si_3N_4$), titanium nitride (TiN), boron nitride (BN), and a mixture of the $SiO_2$, the $Al_2O_3$, the $TiO_2$, the $ZrO_2$, the ZrC, the SiC, the TaC, the $TiB_2$, the $ZrB_2$, the $TiSi_2$, the $Si_3N_4$, the TiN, and the BN.

Figure 5:
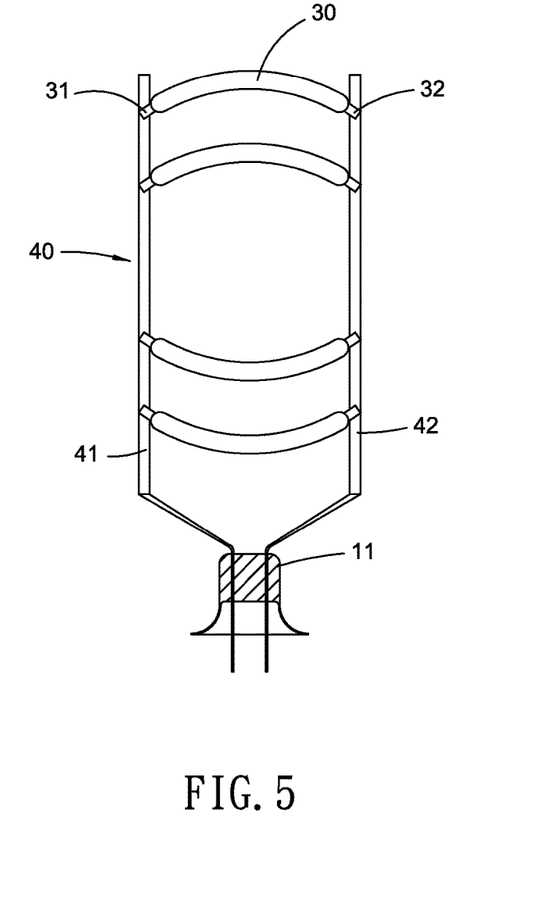
FIG. 5 is a schematic view showing the assembly of a part of an LED light bulb according to another preferred embodiment of the present invention.
Figure 9:
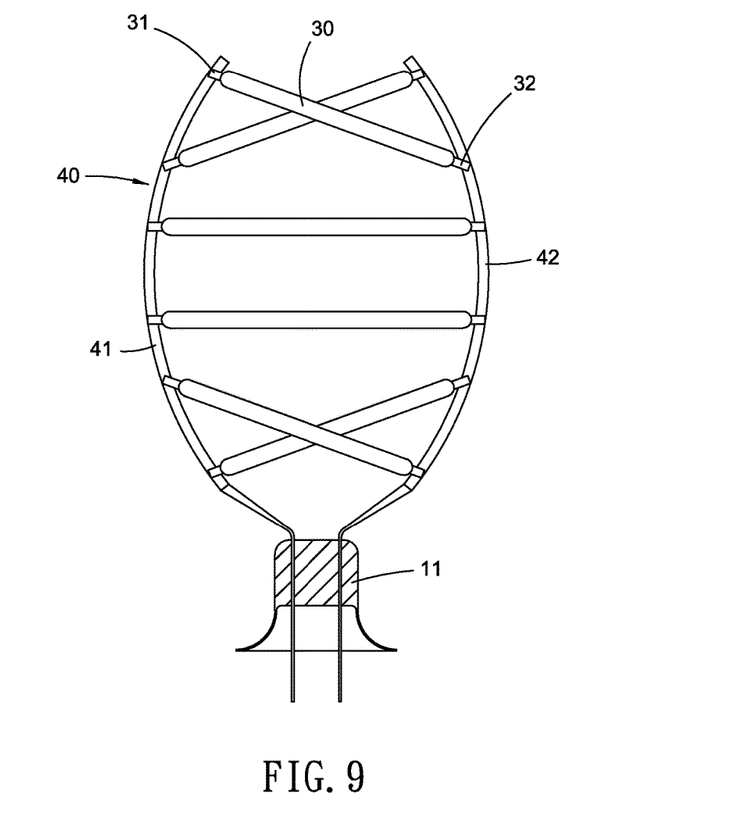
FIG. 9 is a schematic view showing the assembly of a part of an LED light bulb according to another preferred embodiment of the present invention.

Each LED filament 30 is any one of a flexible LED filament, a rigid LED filament, and combination of the rigid and flexible LED filaments, wherein the rigid LED filament is straight and is not bent. As shown in FIG. 5, each LED filament 30 is the flexible LED filament and is bent in an arc shape. As illustrated in FIG. 9, each LED filament 30 is the combination of the rigid and flexible LED filaments.

Referring to FIG. 1, in an embodiment, a plurality of LED filaments 30 are electrically connected with the first metal post 41 and the second metal post 42 of a filament support 40 in a parallel connecting manner.

Figure 2:
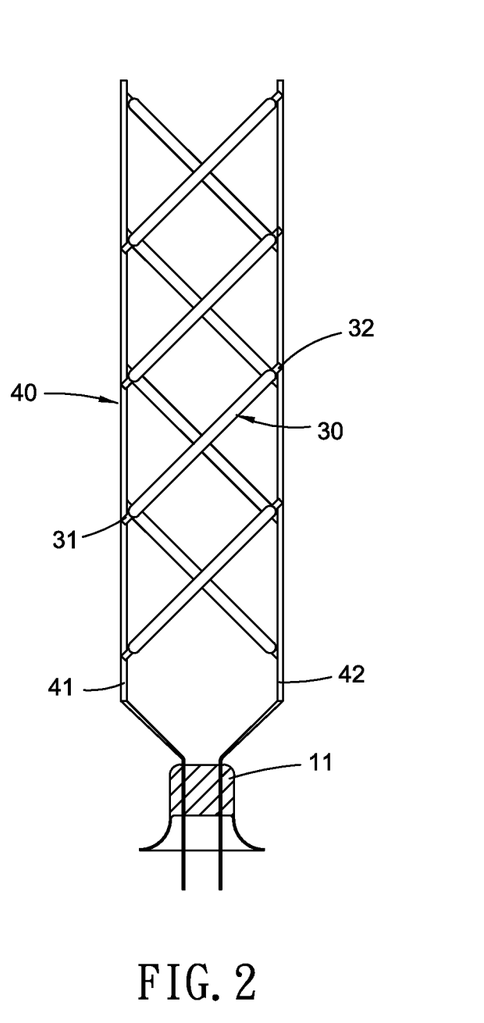
FIG. 2 is a schematic view showing the assembly of a part of an LED light bulb according to another preferred embodiment of the present invention.

As shown in FIG. 2, in another embodiment, multiple LED filaments 30 are electrically connected with the first metal post 41 and the second metal post 42 of a filament support 40 in a parallel connecting manner, wherein and are intersected together so as to increase number of the multiple LED filaments 30 and to enhance lux of the LED light bulb.

Figure 3:
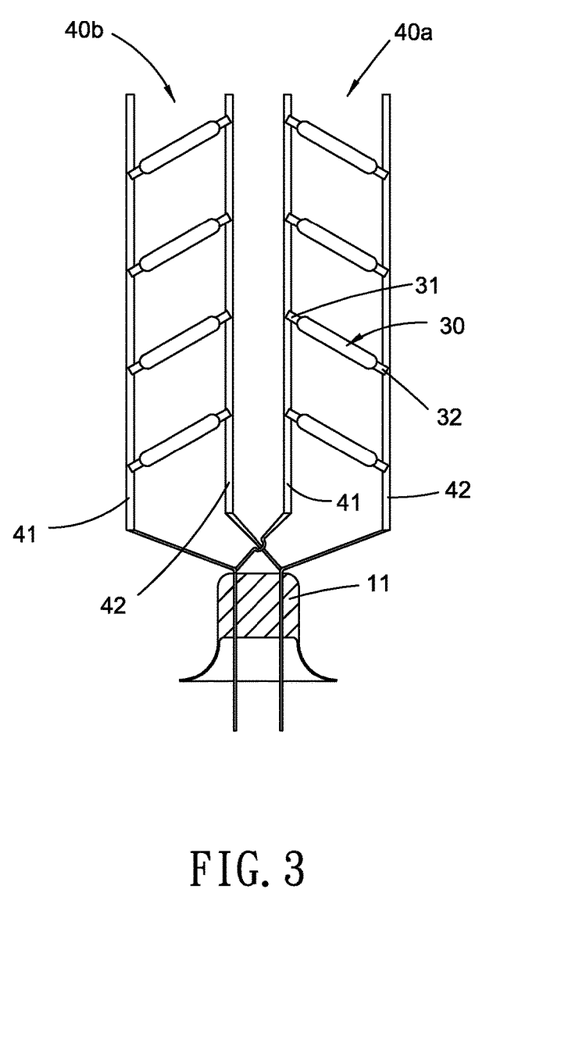
FIG. 3 is a schematic view showing the assembly of a part of an LED light bulb according to another preferred embodiment of the present invention.

As illustrated in FIG. 3, the LED light bulb comprises two filament supports 40, 40a, wherein a first metal post 41 and a second metal post 42 of each of the two filament supports 40, 40a are electrically connected with a positive terminal 51 and a negative terminal 52 of a screw base 10 respectively.

Figure 4:
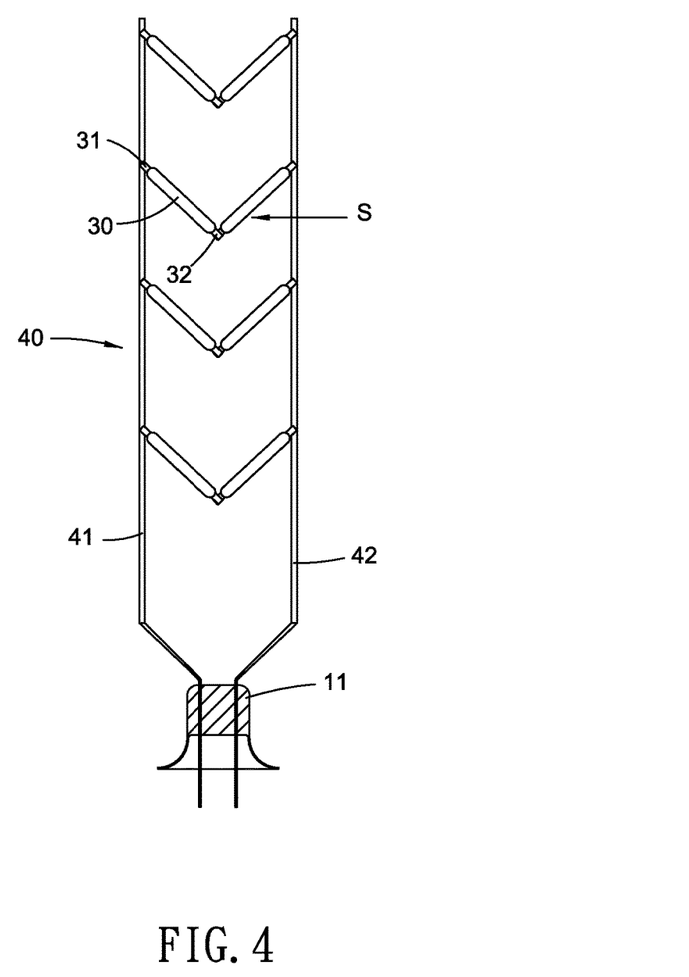
FIG. 4 is a schematic view showing the assembly of a part of an LED light bulb according to another preferred embodiment of the present invention.

Referring to FIG. 4, multiple filament sets S are electrically connected with a first metal post 41 and a second metal post 42 of a filament support 40, wherein each filament set S has two LED filaments 30 which are serially connected together.

Figure 8:
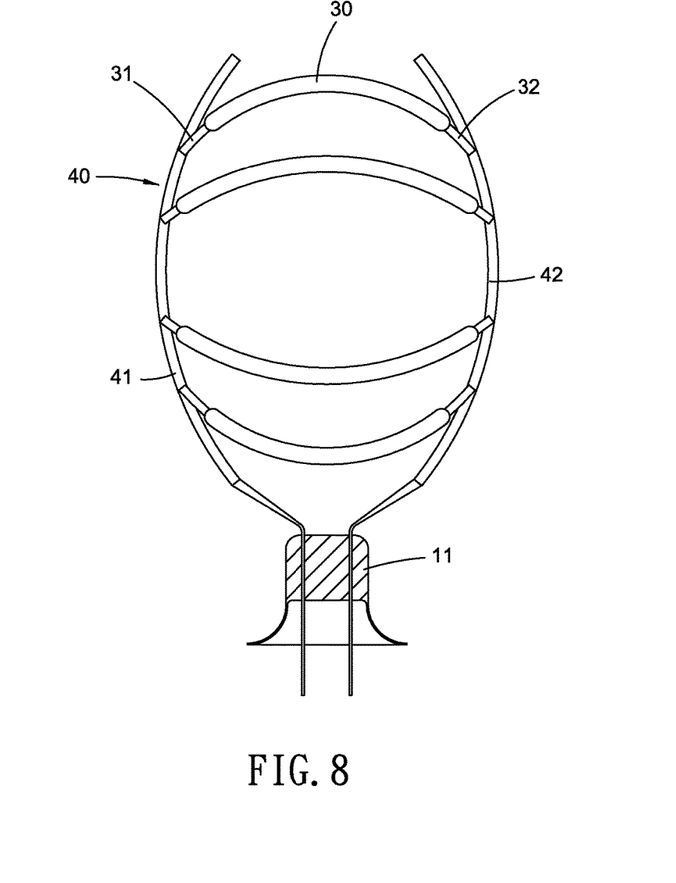
FIG. 8 is a schematic view showing the assembly of a part of an LED light bulb according to another preferred embodiment of the present invention.

Preferably, the first metal post 41 and the second post 42 of each filament support 40 are straight or arcuate, as illustrated in FIGS. 1-5. As shown in FIGS. 8 and 9, the first metal post 41 and the second metal post 42 are arcuate.

While the preferred embodiments of the invention have been set forth for the purpose of disclosure, modifications of the disclosed embodiments of the invention as well as other embodiments thereof may occur to skilled in the art. Accordingly, the appended claims are intended to cover all embodiments which do not depart from the spirit and scope of the invention.

What is claimed is:

1. A light-emitting diode (LED) light bulb comprising: a screw base, a transparent housing, at least one filament support, and at least one LED filament;

the transparent housing being hollow and including an opening, and the screw base including a positive terminal and a negative terminal which are electrically connected with an external power supply so as to supply driving power to the at least one LED filament, wherein each of the at least one filament support includes a first metal post electrically connected with the positive terminal of the screw base and includes a second metal post electrically connected with the negative terminal so as to transmit the driving power;

wherein the at least one LED filament includes a substrate, a first electrode pin and a second electrode pin which are arranged on two sides of the substrate respectively, a thermal radiation coating formed on a back face of the substrate, at least one LED chip molded on a front face of the substrate, a wire, and a fluorescent;

wherein the at least one LED chip is electrically connected with the first electrode pin and the second electrode pin in a series connecting manner by using the wire, wherein the first electrode pin is electrically connected with the first metal post, and the second electrode pin is electrically connected with the second metal post so that an LED drive circuit is defined;

wherein the at least one LED filament and the at least one filament support are accommodated in the transparent housing, and the screw base is housed into the opening of the transparent housing, and the opening is closed.

2. The LED light bulb as claimed in claim 1, wherein a black body radiation layer is also further coated on the first metal post and the second metal post.

3. The LED light bulb as claimed in claim 1, wherein the substrate of each LED filament is made of any one of metal, ceramics, glass, and plastic.

4. The LED light bulb as claimed in claim 1, wherein the substrate of each LED filament is made of any one of metal, flexible ceramics, flexible glass, and plastic.

5. The LED light bulb as claimed in claim 1, wherein each LED filament is any one of a rigid LED filament, a flexible LED filament, and combination of the rigid and flexible LED filaments, wherein the rigid LED filament is straight and is not bent.

6. The LED light bulb as claimed in claim 1, wherein the thermal radiation coating is formed on the back face of the substrate by coating thermal radiation dissipation ink on the back face of the substrate in any one of a spray coating manner, a brushing manner, a screen printing manner, and a nozzle printing manner, wherein the thermal radiation dissipation ink contains dissipation fillers, dispersants, and binders.

7. The LED light bulb as claimed in claim 6, wherein the dissipation fillers are any one of carbon materials, metal particles, ceramics materials, infrared-ray radiation powders, and a mixture of the carbon materials, the metal particles, the ceramics materials, and the infrared-ray radiation powders.

8. The LED light bulb as claimed in claim 6, wherein the carbon materials are any one of graphene, carbon black, graphite, carbon nanotubes, activated carbon and a mixture of the graphene, the carbon black, the graphite, the carbon nanotubes, and the activated carbon.

9. The LED light bulb as claimed in claim 6, wherein the metal particles are any one of copper (Cu), nickel (Ni), zinc (Zn), iron (Fe), cobalt (Co), silver (Ag), gold (Au), platinum (Pt), and a mixture of the Cu, the Ni, the Zn, the Fe, the Co, the Ag, the Au, and the Pt.

10. The LED light bulb as claimed in claim 6, wherein the infrared-ray radiation powders are made of any one of silica ($SiO_2$), alumina ($Al2O3$), titanium dioxide ($TiO_2$), zirconia ($ZrO_2$), zirconium carbide (ZrC), silicon Carbide (SiC), tantalum carbide (TaC), titanium diboride (TiB2), zirconium diboride (ZrB2), two titanium silicide (TiSi2), silicon nitride (Si3N4), titanium nitride (TiN), boron nitride (BN), and a mixture of the $SiO_2$, the $Al_2O_3$, the $TiO_2$, the $ZrO_2$, the ZrC, the SiC, the TaC, the TiB2, the ZrB2, the TiSi2, the Si3N4, the TiN, and the BN.

\* \* \* \* \*